United States Patent
Cirkel et al.

(10) Patent No.: US 7,218,093 B2
(45) Date of Patent: May 15, 2007

(54) REDUCED CHIP TESTING SCHEME AT WAFER LEVEL

(75) Inventors: Cornelis Oene Cirkel, Nijmegen (NL); Pieter Cornelis Nicolaas Scheurwater, Nijmegen (NL)

(73) Assignee: NXP B.V., Eindhoven (NL)

( * ) Notice: Subject to any disclaimer, the term of this patent is extended or adjusted under 35 U.S.C. 154(b) by 103 days.

(21) Appl. No.: 10/527,569

(22) PCT Filed: Aug. 4, 2003

(86) PCT No.: PCT/IB03/03429

§ 371 (c)(1),
(2), (4) Date: Mar. 10, 2005

(87) PCT Pub. No.: WO2004/025313

PCT Pub. Date: Mar. 25, 2004

(65) Prior Publication Data

US 2006/0164114 A1    Jul. 27, 2006

(30) Foreign Application Priority Data

Sep. 13, 2002  (EP) .................... 02078785

(51) Int. Cl.
*G01R 31/28* (2006.01)
*G01R 31/26* (2006.01)
(52) U.S. Cl. .................... 324/158.1; 324/765
(58) Field of Classification Search ........... 324/765, 324/158.1; 702/117, 118
See application file for complete search history.

(56) References Cited

U.S. PATENT DOCUMENTS

| 4,875,002 A | * | 10/1989 | Sakamoto et al. | 324/73.1 |
| 5,714,888 A | * | 2/1998 | Naujoks | 324/750 |
| 6,134,685 A | * | 10/2000 | Spano | 714/724 |
| 6,236,223 B1 | * | 5/2001 | Brady et al. | 324/765 |
| 6,782,331 B2 | * | 8/2004 | Ayadi | 702/68 |
| 2002/0121915 A1 | * | 9/2002 | Montull et al. | 324/765 |

FOREIGN PATENT DOCUMENTS

EP    1 048 956    11/2000

* cited by examiner

*Primary Examiner*—Ha Tran Nguyen
*Assistant Examiner*—Roberto Velez
(74) *Attorney, Agent, or Firm*—Peter Zawilski

(57) ABSTRACT

The present invention relates to production testing of semiconductor devices, more specifically to production testing of such devices at wafer level.

A method according to the present invention comprises the steps of generating (20) quality test-data at a limited number of semiconductor devices on the wafer, deciding (24) based on the generated quality test-data whether other semiconductor devices on the wafer are to be tested, and based on the result of the deciding step, testing (28) or not testing (26) the other semiconductor devices on the wafer.

A corresponding wafer prober is also described.

7 Claims, 3 Drawing Sheets

REDUCED CHIP TESTING SCHEME AT WAFER LEVEL

The present invention relates to testing of semiconductor devices, especially active devices such as chips, more specifically to production testing of such devices at wafer level, i.e. before sawing or dicing the wafer into individual chips and assembly of those chips.

The manufacturing phase of an integrated circuit can be divided into two steps. The first step, wafer fabrication, is a sophisticated and intricate process of manufacturing a silicon chip, also called a die. The second step, assembly, is a highly precise and automated process of packaging the die. Those two phases are commonly known respectively as "front-end" and "back-end". Production testing is testing during manufacturing of the semiconductor devices, which is to be distinguished from chip testing that occurs during design or in support of production, which is often referred to as engineering testing.

Silicon chips are grouped on a silicon wafer before being separated from each other at the beginning of the assembly phase. They are made on each wafer in a multi-step process, each step adding a new layer to the wafer or modifying an existing one. These layers form the elements of the individual electronic circuits. The process steps may for example be etching, diffusing, photo-masking, ionic implantation, metal deposition, doping and passivation.

Between wafer fabrication and assembly, a wafer probing step, also called pre-test, is carried out. The functionality of the semiconductor devices is then verified performing a plurality of, generally electrical, tests, by means of special micro-probes. Wafer probing is composed of two different tests: a process parametric test, which checks the wafer fabrication process itself, and a full wafer probing test, which verifies the functionality of the finished product. The bad dice are marked with e.g. a black dot so they can be separated from the good dice after the wafer is cut. The percentage of good dice on an individual wafer is called its yield.

The reject pattern at pre-test is used by a chip-making factory to detect processing errors at an early stage and to tune their process before a certain error can cause more rejects. Wafer production suffers from two kinds of yield loss:

A predictable yield loss caused by the defect density of the chip-making process, such as a diffusion process for example. The defect density may comprise spot defects caused by particles. These kinds of rejects are randomly distributed over the wafer. For this kind of rejects it can be calculated what the cost effect would be when skipping pre-tests: pre-test costs are eliminated, while final test costs are increased due to a lower yield at final test and the additional costs of packaging of the failing products.

An unpredictable yield loss caused by errors during the production process. These are errors due to malfunctioning of chip-making equipment, e.g. diffusion equipment, manual errors or parameters that slowly drift away during the production over a longer period of time.

For mature products and mature designs in mature processes, high pre-test yields are to be expected due to the low predictable yield loss. Pre-test would therefore not be necessary. However, the unpredictable yield loss has been a valid reason to pre-test all wafers until now.

The first step of assembly after pre-testing is then to separate the silicon chips: this step is called die cutting. Then, the dice are placed on a lead frame: the "leads" are the chip legs that will be soldered or placed in a socket on a printed circuit board. At this stage the device is completely functional, but it would be impossible to use it without some sort of supporting system. Any scratch would alter its behavior or impact its reliability, any shock would cause failure. Therefore, the dice are put into a ceramic or plastic package to be protected from the external world. Thin wires, for micro-controllers a typical value is 33 microns, connect chips to the external world and enable electronic signals to be fed through the chip. The process of connecting these thin wires from the chip's bond pads to the package lead is called wire bonding. The package not only protects the chip from external influences, but also makes the whole device easier to handle.

At the end of the assembly process, the integrated circuit is tested once again by automated test equipment. This is called final testing. Only the integrated circuits that pass the tests will be shipped to their final destination. High reject rates at final test can lead to serious delivery problems at the customers. Furthermore, when a fault is detected at final test instead of at pre-test, it is detected at a much later moment in time. The feedback loop back to a relevant manufacturing process is much longer in this case, which means that all wafers produced during the corresponding time interval can be worthless too.

Another reason for pre-test is that after assembly the location of the fail at the wafer is missing. Information about the shape and the location of the fails are significant for the chip-making factories to find the root cause of an error.

To reduce their testing time, manufacturers are testing multiple devices simultaneously, thus increasing the numbers of pins required on a probe card.

The largest possible reduction in testing time would be to test each parameter only once either by skipping the pre-test or the final test completely, or by splitting up these tests over pre-test and final test, reported as concurrent testing. Skipping final test may be done, but it is risky due to several production steps after pre-test like inking, grinding and sawing, which may damage the integrated circuit. Also a relevant factor is that due to assembly, mechanical stress within the silicon chip itself, caused for example by the pressure of the plastic, results in additional fails. Due to this stress, parts may become an open or a short. Products that fail due to this mechanism may sometimes pass after removing the package from the chip.

According to one prior art method, every chip is tested with at least a single test $T_1$ of N such tests. If the result of test $T_1$ is good, a test $T_2$ is performed on the chip. If the result of test $T_2$ is bad, the chip is marked to be a bad product; and testing is done on the next chip. If a chip has positively passed all N tests provided, it is marked to be a good product, and the next chip is tested.

In JP-08-274139, sampling positions are identified in a wafer, and all test item measurements are carried out at the sampling positions of all wafers. Next, the results of the sampling measurements are examined, and each wafer is judged to be of good, medium or bad quality. Bad wafers are eliminated. Next, the results of the wafer judging step are examined, and a lot judging is processed, based on the number of good wafers in the lot. Also the lot can be of good, medium or bad quality, depending on the number of good wafers it comprises. If the lot is considered to be good, the circumference field of the good and medium wafers is removed, and what is left is considered to be good products. If the lot is considered to be medium, the circumference field of the good wafers is removed, and the medium quality wafers are tested completely. If the lot is considered to be bad, the good and medium quality wafers are completely tested. Decisions for complete testing of a wafer are not taken in view of the sampling measurements of that wafer, but on the basis of the result for the whole lot.

To tell something about errors in wafer masks and wafer steppers, it is possible to fully test one wafer in a batch. On this fully tested wafer all stepper and mask errors are visible and can be corrected by the chip-making factory. Although the yield loss due to these errors may be low, it is repeated on each wafer, which leads to a lot of rejects in the end.

General methods of testing semiconductor wafers and devices during manufacture thereof and by users thereof are described in the books "Integrated Circuit Manufacturability", by de Gyvez and Pradham, IEEE, 1999 and "Reliability of Electronic Components", by Bajenescu and Bazu, Springer Press, 1999.

It is an object of the present invention to provide test cost reduction and testing time reduction during wafer testing of IC's, diodes and transistors, in general of any device manufactured on a semiconductor wafer.

It is a further object of the present invention to increase test capacity for the wafer level testing of semiconductor devices.

The above objectives are accomplished by a method and device according to the present invention.

A basic idea of a pre-test method and device according to the present invention is to identify the unpredictable yield loss by testing just a sample of products at each wafer. If the yield for this sample meets the defect density of the process and if this sample covers enough area to detect any specific pattern, then there is no need to test the rest of the wafer. If not, then the full wafer should be tested.

The present invention provides a method for testing quality of semiconductor devices on a wafer. The method comprises the steps of:

generating quality test-data for a limited number of semiconductor devices on the wafer, deciding based on the generated quality test-data whether other semiconductor devices on the wafer are to be tested, or not to be tested, based on the result of the deciding step, testing or not testing the other semiconductor devices on the wafer, and if some semiconductor devices have not been tested, selecting at least one non-tested semiconductor device on the wafer for further processing. By "a limited number" is meant less than the total number, especially less than half, for example, 25% or less, 10% or less or 5% or less.

The decision step may be made in accordance with a pre-determined decision parameter, such as for example a comparison of a yield calculated from the generated quality test-data, with a pre-set value. This pre-set value may be 80% or more, preferably 90% or more, more preferred 95% or more, still more preferred 97% or more. The pre-set value of the acceptable yield is depending on the size of the dies.

The deciding step may be, but does not need to be, a step of automatically deciding.

In a method according to the present invention, the quality test-data may give an indication of the quality of the fabrication process used for manufacturing the semiconductor devices. Alternatively, the quality test-data may give an indication of the functionality of a semiconductor device.

The limited number of semiconductor devices which are initially tested may be located on the wafer as determined by a spatial pattern. Such spatial pattern may comprise a circular pattern and/or an X-cross pattern and/or a pattern in the form of a plus sign. Alternatively, the spatial pattern may comprise a spiral pattern. Still according to another embodiment, the pattern may be a render pattern, i.e. a pattern which scans the wafer line by line, in which every $x^{th}$, for example but not limited thereto, every $4^{th}$, $10^{th}$ or $20^{th}$ device is tested.

All semiconductor devices on the wafer may be the same or some of them may be different.

The semiconductor devices may be active or passive semiconductor devices.

The step of generating quality test data preferably includes only non-destructive testing.

The present invention also provides a method for testing quality of semiconductor devices on a plurality of wafers. This method comprises the steps of:

generating quality test-data for a limited number of semiconductor devices on a number of wafers from the plurality of wafers, deciding, based on the generated quality test-data, for each of the tested wafers, whether other semiconductor devices on the tested wafers are to be tested, or not to be tested, based on the result of the deciding step, testing or not testing the other semiconductor devices on the tested wafers, and if some semiconductor devices have not been tested, selecting at least one non-tested semiconductor device on the wafer for further processing. By "a limited number" is meant again less than the total number, especially less than half, for example, 25% or less, 10% or less or 5% or less. The limited number of semiconductor devices on each of the wafers are located on the wafers as determined by a spatial pattern. This spatial pattern is such that, by shifting, e.g. rotating, it between wafers, a substantially complete wafer-map can be obtained, i.e. by stacking different wafermaps, a full wafermap can be obtained.

The present invention also provides a method for manufacturing a plurality of semiconductor devices on a wafer, wherein one of the method steps comprises a step of quality testing according to a testing method of the present invention.

The present invention furthermore provides a wafer prober for testing a plurality of semiconductor devices on a wafer. The wafer prober comprises:

selecting means for selecting a limited number of the plurality of semiconductor devices on the wafer which will be tested, at least one probe for measuring whether a selected semiconductor device meets at least one pre-set quality specification, the at least one probe generating quality test results, and deciding means for deciding, based on the quality test results, whether other semiconductor devices on the wafer are to be tested or not to be tested.

The wafer prober may comprise a plurality of probes for establishing a temporary electrical contact between the wafer prober and an individual semiconductor device on a wafer. The wafer prober may also comprise at least one optical measurement device for carrying out optical measurements.

The wafer prober may furthermore comprise a memory means for saving the generated test results.

The at least one pre-set specifications may be a design and/or performance specification.

The quality test results may be non-destructive test results.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

DEFINITIONS

Figure 1:
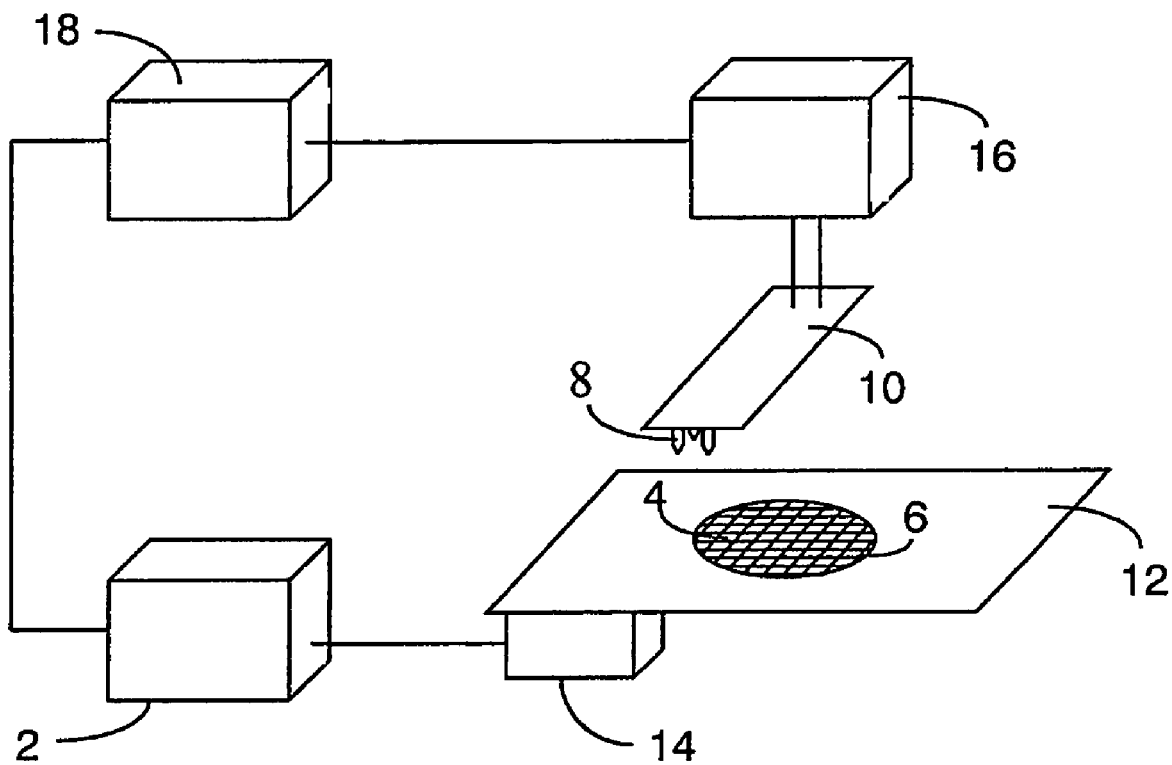
FIG. 1 is a schematic elevational view of a wafer probing test system according to an embodiment of the present invention.

Wafer: a thin slice of semiconductor material with parallel faces on which arrays of microcircuits or individual semiconductors are formed.

Yield: the ratio of usable components selected after a screening test compared to the number of components submitted for the test.

Active semiconductor devices on a wafer: include semiconductor devices comprising active transistor components, especially multi-component semiconductor devices such as integrated circuits, applications specific integrated circuits (ASIC), other custom circuits including a plurality of transistors such as Liquid Crystal display active matrices, hybrid circuits, memories, microprocessors, and gate arrays such as field programmable gate arrays (FPGA) present on a wafer.

Integrated circuit: a monolithic microcircuit consisting of interconnected active and passive elements inseparably associated with each other and formed in situ or within a single substrate to perform an electronic circuit function.

Passive semiconductor device: refers to passive components such as resistors, capacitors, inductors, antennas.

Screening test: a test or combination of tests intended to measure certain parameters during the running production in order to monitor, control and improve the process. It is not used to select individual pass or fail devices or wafers. It is also a test for monitoring of a process or package. Some products in a certain chip-making process, such as a diffusion process for example, or a certain package are put on life test. They represent all other products or wafers in the same chip-making process or the same package.

Burn-in: an operation applied to semiconductor devices prior to their ultimate use intended to stabilize their characteristics and to identify those devices which lead to early failure. Usually, involves electrical and/or temperature stressing of the device which would cause failure of marginal devices.

Dynamic testing: testing a circuit where reactions to alternating currents are evaluated.

Chip: a single substrate on which all the active and passive components have been fabricated. A chip is generally not ready for use before it is packaged and provided with external connections. A die and a chip are synonymous.

Package: a container for an electronic component with terminals to provide electrical and/or optical access to the inside of the container.

Quality test: test to verify whether an item conforms to specified requirements. The test generally is a non-destructive test. However, sometimes a "voltage screen test" is performed during the running production on each device. In this test a high voltage, which is X percent above the normal working voltage, for example 10%, 20% or 200%, is put on the device under running condition. Before and after this test a.o. the supply current is measured. If the current before and after this "stress test" is not the same, the product is damaged due to this stress test and it is rejected. This test is meant to catch early failures and to prevent them to reach the customer. Mainly the quality of the gate oxide is thereby tested. In this case the quality test has destroyed a "well working" device. Another exception to non-destructive testing is trimming/zenerzapping. During pre-test or final test a parameter is measured. If the parameter is not within the device specification it is sometimes possible, but only in a special designed circuit, to add or subtract a small percentage to or from this parameter by trimming, such as poly trimming, OTP, etc., or by zener zapping. This trimming or zapping process destroys certain components in the chip. The same trimming/zenerzapping process may also be used to add or lock certain IC-functions for specific customers.

Reliability test: test and analyses carried out in addition to other type tests to evaluate the level of reliability in a product as well as dependability or stability of this level relative to time and optionally under different environmental conditions. Testing certain parameters on lifetime.

Wafer probe test: quality testing on a wafer. Also called pre-test or e-sort. All tests done at product level to examine if the device meets the expected quality.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. For example, the size of chips 4 and probe tips 8 in FIG. 1 is exaggerated.

Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Reference will mainly be made in the following to chips on wafers but the present invention relates to the testing of any semiconductor device produced on wafer level, including but not limited to IC's, diodes, transistors. The components may be active semiconductor devices, especially multi-component, monolithic devices fabricated on a wafer.

A typical semiconductor wafer is 200 mm (8 inch) in diameter and usually contains 500 to 10000 chips. There is a recent trend to make a transition to 300 mm (12 inch) wafers, comprising still more chips. The size of the wafer is not considered to place a limitation on the present invention.

Wafer probing according to the present invention may establish a temporary electrical contact between test equipment and a limited number of individual chips on a wafer to determine whether each of those chips meets design and performance specifications. Alternatively, optical measurements may be carried out. The test equipment transmits signals, e.g. electrical signals or optical signals, to the chips, and analyses the signals that return. The tests are, most of the time, non-destructive. The tests are non-reliability tests, i.e. do not determine the expected lifetime of a component. A wafer probing test system according to the present invention is shown in a highly schematic embodiment in FIG. 1.

It comprises:

Selecting means 2: These select a limited number of a plurality of chips 4 on the wafer 6 to be tested, which limited number of chips 4 will be tested only in a first step.

Probe tips 8: A conventional probe or probe tip 8 is a single, typically tapered, metal needle whose tip is positioned to touch-down or make electrical contact with a metalized bond pad on the chip 4 being tested. A typical bond pad ranges from 40 to 150 microns in width and 60 to 150 microns in length. The dimensions of the bond pads depend on the thickness of the bond wire and the current through the wire. Each chip 4 contains numerous bond pads, which connect to the chip circuitry so that electrical signals can be transmitted in and out of the chip 4.

A probe card 10: A probe card 10 is a complex printed circuit board that contains a customized arrangement of probe needles or probe tips 8 to simultaneously contact all of the bond pads on one or more chips 4. Probe cards 10 are primarily used in production testing.

A probe station 12: A probe station 12 manually or automatically aligns the wafer 6 with the probe card 10 or vice versa, to permit the probes 8 to precisely contact the bond pads of the chip 4 or chips. On the probe station 12, a motor 14 may be provided for driving it. Selecting means 2 may be connected to the motor 14, so that when selecting a certain chip 4 to be tested, the motor 14 of the probe station 12 automatically moves the probe station 12 to a location next to the probe tips 8 suitable for testing that specific chip 4.

Test equipment 16: Test equipment 16 transmits electrical signals through the probes 8 and probe card 10 to the chip 4 or chips and evaluates the signals that return. Test equipment 16 used in production test is often called automated test equipment, or ATE, and is designed specifically for high-volume testing. The test equipment 16 comprises a decision unit 18 which decides, based on the returning signals, whether other chips on the wafer 6, not originally selected by the selecting means 2, are to be tested as well. If so, suitable signals are sent from the decision unit 18 to the selecting means 2, which then controls the motor 14 of the probe station 12 so as to allow each chip 4 not previously tested to be tested. Alternatively, all chips can be tested in this second step.

Figure 2:
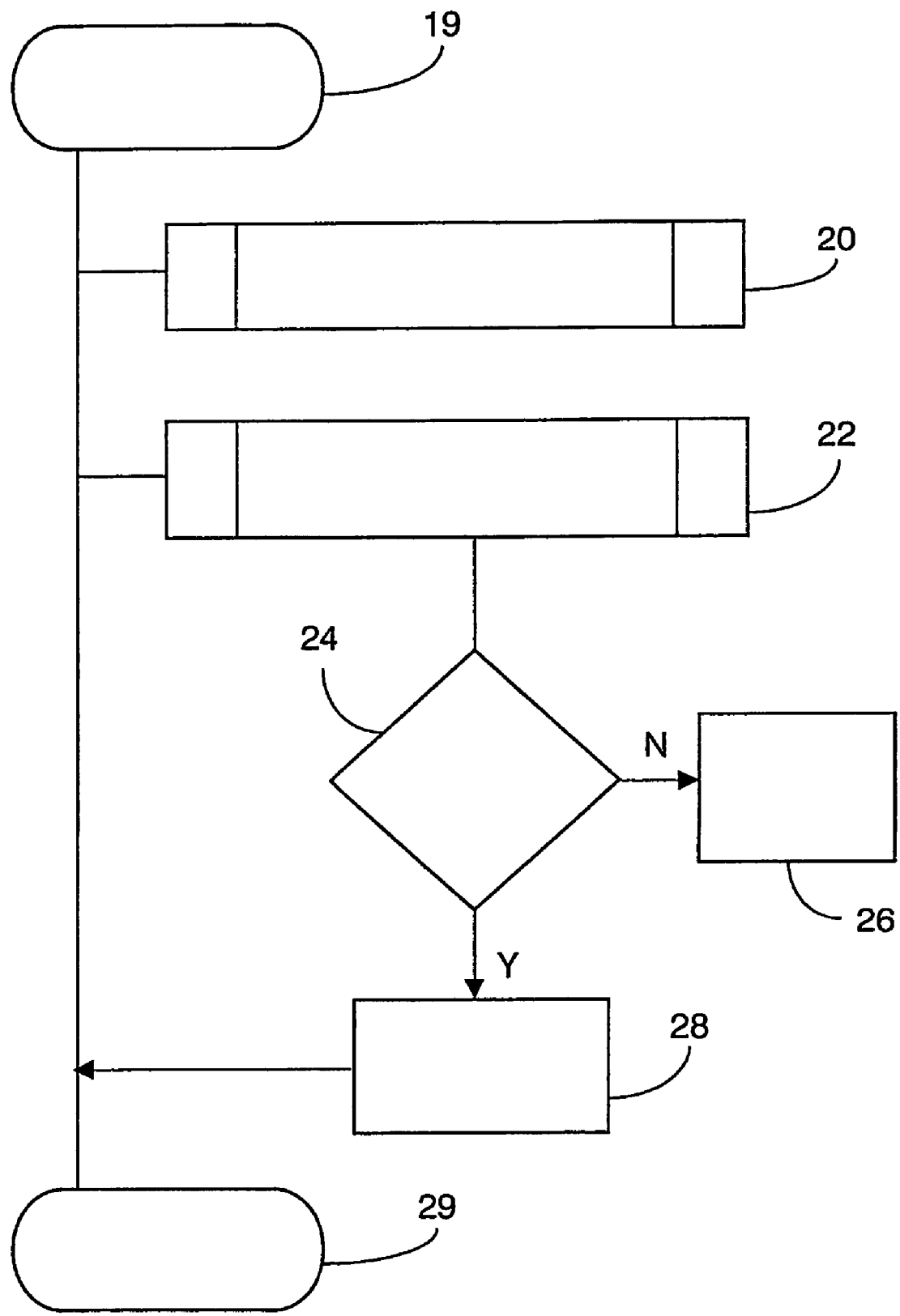
FIG. 2 is a flow chart of a method for testing quality of semiconductor devices on a wafer according to an embodiment of the present invention.

A schematic block diagram of an embodiment of the method according to the present invention is shown in FIG. 2. The method is started at block 19. In a first step 20, a sampling measurement is carried out, which generates quality test-data for a limited number of chips 4 on the wafer 6. In a second step 22, the result of the sampling measurement 20 is considered/analyzed, and a decision is taken in a third step 24, based on the generated quality test-data, whether other chips 4 on the wafer 6 are to be tested as well. This decision may be based on a calculation of the yield from the generated test-data, and a comparison of this yield with a pre-set value, e.g. if the calculated yield is 95% or more, preferably 97% or more, no other chips 4 are to be tested. If the result of the decision taking step is that the yield is high enough compared to the pre-set value, further tests on not-previously tested chips are omitted (step 26). If however, the calculated yield is lower than the pre-set value, then all other chips 4 on the wafer 6 are tested in step 28, and each chip is marked as either being good or bad, depending on the results of the tests. The measurement is then finished (block 29).

Figure 3:
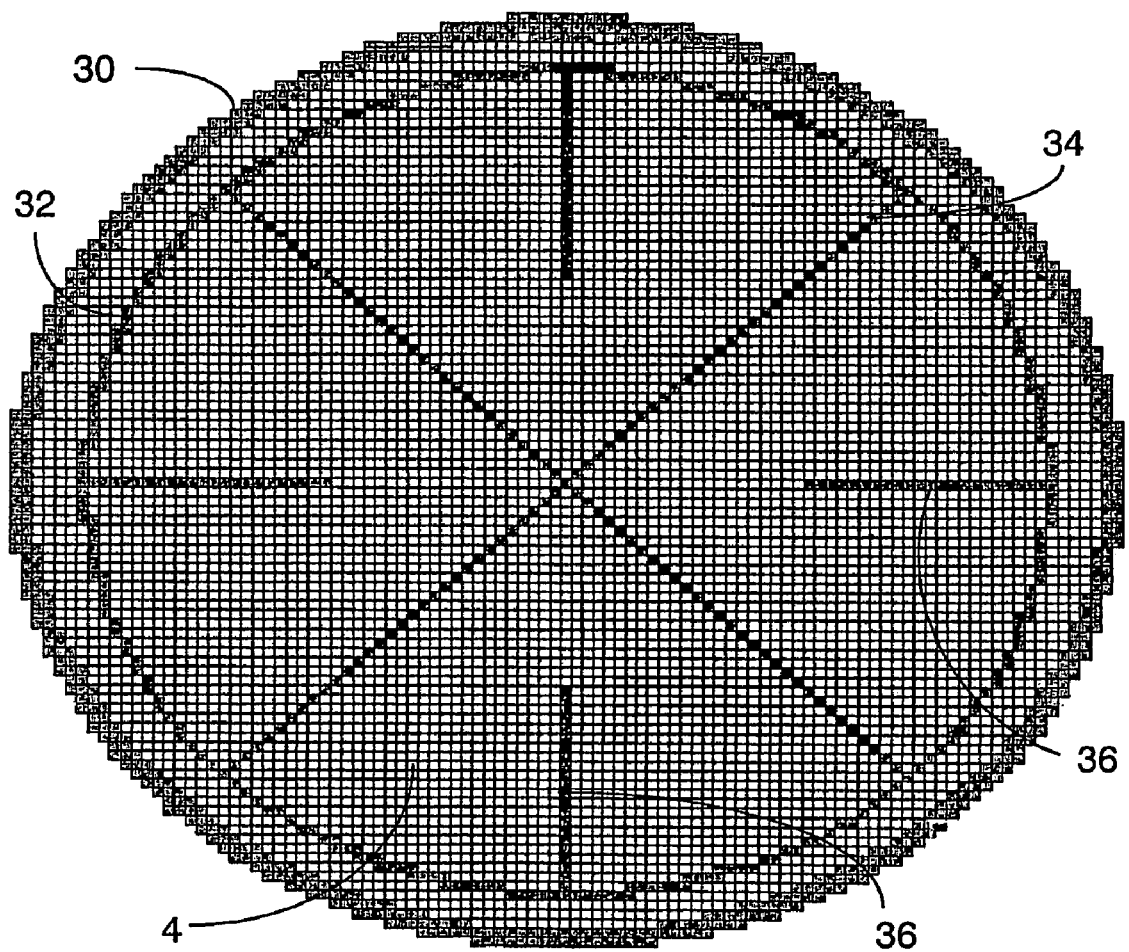
FIG. 3 is a view of a car wheel test pattern that can be used with the present invention.

According to an embodiment of the present invention, the sample of products tested on the wafer 6, is preferably tested according to a predefined pattern, for example a car wheel pattern as shown in FIG. 3. This car wheel pattern comprises a "circle pattern" 30, 32 nearby the edge of the wafer. This pattern covers edge incidents. The car wheel pattern also covers an "X-cross pattern" 34 together with a "+-pattern" 36. These patterns 30, 32, 34, 36 together cover area failures.

Test-data will be generated from the chips 4 laying on those patterns 30–36. The generated test-data is a reliable reflection of the quality in every region of the wafer.

A yield-target of these tested samples is necessary to make decisions for carrying out or not the 100% test of the same wafer. To have a sharp decision level to decide whether the full wafer should be tested, chips which belong to certain areas of the wafer may be discarded, e.g. the chips close to the edge of a wafer, called ugly dice, should not be tested in the pattern, since the yield close to the edge is less predictable. For example 5 to 10 mm from the edge of a wafer may be excluded. Ugly dice should preferably always be rejected from testing. They have always been rejected in conventional tests as well, even when they would pass the test program, because it is known that these devices tend to have a higher risk to become early failures, which will lead to customer complaints.

Preferably the above method of sample based testing is combined with a complete testing of every $N^{th}$ wafer, to check for wafer stepper errors. For example one wafer of twenty-five is always tested 100%, and from the remaining 24 wafers a limited number of dice is tested. Depending on the results obtained for those 24 wafers, each of those 24 wafers are tested 100% or not, according to the present invention.

When using the "car wheel pattern" as explained above, it is for instance possible to reconstruct a complete wafer-map pattern by stacking individual wafermaps. Or in other words, if the "car wheel pattern" represents 10% of the chips and on each wafer consists of another group of devices, the pattern being shifted by turning or moving it, then the stack of 10 turned patterns can map to a full wafermap. This will omit the need to test one full wafer to check for wafer mask and wafer stepper errors.

Furthermore, if more than X wafers are fully tested in a batch, e.g. more than 20% of the wafers are fully tested due to decisions according to the present invention, then preferably all wafers should be fully tested. This may be manually controlled.

As an experiment 10% of chips on wafers were tested according to the present invention in a car wheel pattern as shown in FIG. 3. The pre-set yield value for deciding whether a wafer should be fully tested was set at 97%. 20% of the tested wafers had a yield <97%, and were therefore fully tested. This resulted in a ratio where at 80% of the wafers only 10% of the chips were tested. Only at 20% of the wafers, all chips at the wafer were tested. This resulted in a testing time reduction of 66% during pre-test. Total throughput time was thus reduced to about 33% of the original throughput time.

Apart from the testing time reduction, this method is also very useful because it can increase the pre-test capacity and thus the production volume by 66% during periods when there is a shortage on tester capacity.

The above method is easy to implement in existing testing environments. It can be implemented within a time frame of a couple of hours for a new product.

It is to be understood that although preferred embodiments, specific constructions and configurations, have been discussed herein for devices according to the present invention, various changes or modifications in form and detail may be made without departing from the scope and spirit of this invention. For example, a wheel pattern has been described as a pattern for the sampling measurement, but any pattern suitable for obtaining representative quality test-data, such as for example a spiral pattern or a random pattern, can be used.

The invention claimed is:

1. A method for testing quality of semiconductor devices on a wafer, the method comprising the steps of:
   generating quality test-data for a limited number of semiconductor devices on the wafer,
   deciding based on the generated quality test-data whether other semiconductor devices on the wafer are to be tested, or not to be tested,
   based on the result of the deciding step, testing or not testing the other semiconductor devices on the wafer, and
   if some semiconductor devices have not been tested, selecting at least one non-tested semiconductor device on the wafer for further processing.

2. A method according to claim 1, wherein the deciding step is a step of automatically deciding based on a comparison of a yield calculated from the generated quality test-data, with a pre-set value.

3. A method according to claim 1, wherein the limited number of semiconductor devices are located on the wafer as determined by a spatial pattern.

4. A method according to claim 3, wherein the pattern comprises a pattern selected from one or more of a circular pattern, an X-cross pattern, a pattern in the form of a plus sign, a spiral pattern.

5. A method for testing quality of semiconductor devices on a plurality of wafers, the method comprising the steps of:
   generating quality test-data for a limited number of semiconductor devices on a number of wafers from the plurality of wafers,
   deciding, based on the generated quality test-data, for each of the tested wafers, whether other semiconductor devices on the tested wafers are to be tested, or not to be tested,
   based on the result of the deciding step, testing or not testing the other semiconductor devices on the tested wafers, and
   if some semiconductor devices have not been tested, selecting at least one non-tested semiconductor device on the wafer for further processing,
   wherein the limited number of semiconductor devices on each of the wafers are located on the wafers as determined by a spatial pattern, the spatial pattern being such that, by shifting it between wafers, a substantially complete wafer-map can be obtained.

6. A method according to claim 5, wherein the shifting of the spatial pattern comprises a rotation of the spatial pattern.

7. A method for manufacturing a plurality of semiconductor devices on a wafer, one of the method steps comprising a step of quality testing according to any of the claims 1 or 5.

* * * * *